(12) United States Patent
Sakakura

(10) Patent No.: US 6,578,753 B1
(45) Date of Patent: Jun. 17, 2003

(54) ULTRASONIC TRANSDUCER FOR A BONDING APPARATUS AND METHOD FOR MANUFACTURING THE SAME

(75) Inventor: Mitsuaki Sakakura, Iruma (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 09/580,475

(22) Filed: May 26, 2000

(30) Foreign Application Priority Data

May 28, 1999 (JP) ............................. 11-149629

(51) Int. Cl.$^7$ .................. B23K 1/06; B23K 37/00; B23K 20/10; B32B 31/16
(52) U.S. Cl. .................. 228/110.1; 228/4.5; 228/180.5; 228/1.1; 156/73.1; 156/580.1
(58) Field of Search .............................. 228/1.1, 110.1, 228/4.5, 180.5; 156/73.1, 580.1

(56) References Cited

U.S. PATENT DOCUMENTS

| 3,595,325 A | * | 7/1971 | Libby et al. | 173/117 |
| 3,607,580 A | * | 9/1971 | Obeda | 156/580 |
| 3,727,619 A | * | 4/1973 | Kuris | 156/73.2 |
| 3,747,870 A | * | 7/1973 | Bonis et al. | 173/117 |
| 4,176,454 A | * | 12/1979 | Hatter et al. | 366/127 |
| 4,208,001 A | * | 6/1980 | Martner | 156/73.1 |
| 4,370,131 A | * | 1/1983 | Banko | 156/73.1 |
| 4,475,681 A | * | 10/1984 | Ingle | 228/4.5 |
| 4,782,990 A | * | 11/1988 | Patrikios et al. | 156/73.2 |
| 5,085,719 A | * | 2/1992 | Eck | 156/580.1 |
| 5,377,894 A | * | 1/1995 | Mizoguchi et al. | 228/1.1 |
| 5,385,288 A | * | 1/1995 | Kyomasu et al. | 156/580.1 |
| 5,465,468 A | * | 11/1995 | Manna | 29/25.35 |
| 5,540,807 A | * | 7/1996 | Akiike et al. | 156/580.1 |
| 5,603,444 A | * | 2/1997 | Sato | 228/1.1 |
| 5,603,445 A | * | 2/1997 | Hill et al. | 228/4.5 |
| 5,667,130 A | * | 9/1997 | Morita et al. | 228/110.1 |
| 5,772,100 A | * | 6/1998 | Patrikios | 156/580.1 |
| 5,816,476 A | * | 10/1998 | Buice et al. | 228/102 |

FOREIGN PATENT DOCUMENTS

| JP | 4-291937 A | * | 10/1992 | |
| JP | 10-303240 A | * | 11/1998 | 228/1.1 |

* cited by examiner

Primary Examiner—Tom Dunn
Assistant Examiner—L. Edmundson
(74) Attorney, Agent, or Firm—Koda & Androlia

(57) ABSTRACT

An ultrasonic transducer used in a bonding apparatus, comprising a first hollow section, which communicates with a rear end opening formed in a base end of a horn body of the transducer, and an inner unit, which is installed inside the first hollow section. The inner unit comprises a vibrator assembly and a pressing block, and the pressing block pushes and fastens in place the vibrator assembly in the first hollow section. A through-hole is formed in the central portion of the inner unit, and a second hollow section and third hollow section are further formed in the horn body. Signal wires are connected to the vibrator assembly through the rear end opening.

6 Claims, 5 Drawing Sheets

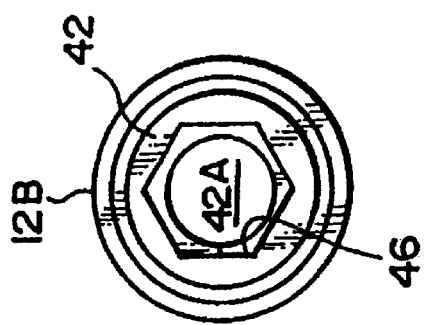
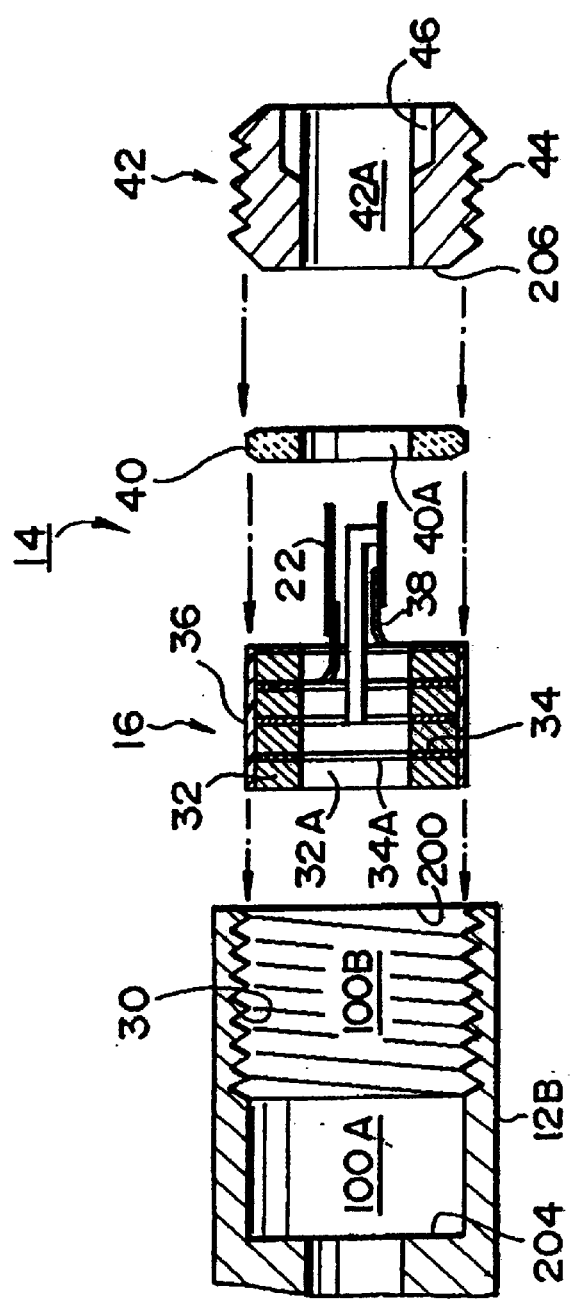

ULTRASONIC TRANSDUCER FOR A BONDING APPARATUS AND METHOD FOR MANUFACTURING THE SAME

BACKGROUND OF THE INVENTION

1. Field of the Invention

The present invention relates to an ultrasonic transducer which generates an ultrasonic vibration in a bonding apparatus used in a semiconductor manufacturing apparatus.

2. Prior Art

Wire bonding apparatuses, bump bonding apparatuses and single-point bonding apparatuses are known to be used in semiconductor manufacturing apparatuses. In such apparatuses, an ultrasonic transducer is utilized in order to apply an ultrasonic vibration to the bonding parts. In this regard, an ultrasonic press-bonding system which joins the bonding parts by combining ultrasonic vibration and a load, and a combination ultrasonic and thermal press-bonding system which applies an ultrasonic vibration while heating the bonding parts to, for instance, approximately 200° C., etc., are known.

Langevin type transducers (bolt-fastened transducers) are known as conventional ultrasonic transducers for use in bonding apparatuses. Such transducers are generally constructed from a bolt-fastened vibrator (Langevin vibrator), a horn through which the ultrasonic wave generated by this vibrator is transmitted, and a bonding tool which is attached to the tip end of this horn.

Bolt-fastened vibrators are ordinarily constructed from a plurality of electrostriction elements, a plurality of electrodes that are installed between these electrostriction elements, a bolt which is passed through the electrostriction elements and electrodes, and a pair of blocks which firmly hold a laminated body comprising the electrostriction elements, etc., via the bolt. In this structure, the side surfaces of the respective electrostriction elements are exposed to the outside, and the respective electrodes are connected to signal wires on the side surface of the laminated body.

Since the signal wire connections are done on the side surface of the transducer, these connecting portions form a part of the space occupied by the transducer. As a result, the transducer, particularly its rear end portion, cannot be formed with a small diameter.

In semiconductor manufacturing apparatuses, other mechanisms (e.g., a sample holding mechanism, etc.) are present beneath the transducer when the bonding tool is caused to contact the bonding parts; accordingly, physical interference (collision) between these mechanisms and the ultrasonic transducer must be avoided. Consequently, it is desirable to reduce the diameter of the ultrasonic transducer. In other words, it is desirable to reduce the size of the transducer in order to insure or enlarge the space through which movement is possible.

Furthermore, it is also desirable to lighten the weight of the ultrasonic transducer in order to reduce the driving load and improve the driving response characteristics during the movement of the ultrasonic transducer. In conventional ultrasonic transducers, since the laminated body comprising the electrostriction elements, etc. is exposed to the outside, this laminated body is directly exposed to heat radiation from the heater that is provided beneath the ultrasonic transducer. As a result, there is a danger of a change in the vibration characteristics caused by heating.

Furthermore, in conventional ultrasonic transducers, a connecting part is located between the block on the front side of the vibrator and the horn. If a large cross-sectional step is present here, the vibration transmission efficiency drops.

Japanese Patent Application Laid-Open (Kokai) No. H10-303240 discloses an ultrasonic transducer in which a hollow section is formed inside the horn in the axial direction of the horn. This hollow section is for reducing the weight of the ultrasonic transducer; and a Langevin vibrator is installed on the rear end of the horn. Thus, in this prior art, the surfaces of the electrostriction elements are exposed to the outside, and the electrostriction elements are connected to the signal wires on the outer surfaces of the electrostriction elements. Accordingly, it is difficult to reduce the diameter of the ultrasonic transducer (especially the rear end portion), and it has problems similar to those described above.

SUMMARY OF THE INVENTION

Accordingly, the present invention was created in light of the above-described conventional problems; and one object of the present invention is to reduce the size of the ultrasonic transducer, especially the rear end portion.

Another object of the present invention is to avoid wire connections on the outer surface of the laminated body in the ultrasonic transducer.

Still another object of the present invention is to make it possible to embed the laminated body inside the horn in the ultrasonic transducer and also to achieve a reduction in the weight of the ultrasonic transducer.

In order to accomplish the above objects, in the present invention which is for an ultrasonic transducer that is installed in a bonding apparatus, the transducer includes a horn body and a vibrator assembly; and the horn body has a bonding tool attached to the tip end portion and a first hollow section formed in at least the rear end portion, and the vibrator assembly is accommodated in the first hollow section and generates an ultrasonic vibration.

In above structure, the first hollow section is formed in the rear end portion of the horn body, and the ultrasonic wave generated by the vibrator assembly inside this hollow section is transmitted to the bonding tool via the horn body. Then, the ultrasonic vibration of the bonding tool is transmitted to the bonding parts.

In the present invention, since the vibrator assembly is accommodated inside the rear end portion of the horn body, the shape of the rear end portion of the horn body can be simplified, and the diameter of this rear end portion can be reduced. Furthermore, the present invention is also advantageous in that the vibrator assembly can be physically and thermally protected. In addition, the working characteristics are good, and the manufacturing cost can be reduced.

Preferably, the ultrasonic transducer of the present invention includes a fastening member which is inserted via a rear end opening formed in the rear end portion of the horn body so as to push the vibrator assembly into the first hollow section and fastens the vibrator assembly in place. The internal circumferential wall of the first hollow section in the horn body functions as a tightening member between both ends of the vibrator assembly.

The circumferential wall has, for example, a cylindrical shape. If necessary, one or more openings may be formed in this circumferential wall. It is desirable that the horn body including the circumferential wall be formed as an integral unit. In such a structure, the number of components can be reduced so that manufacturing costs is reduced, and the ultrasonic vibration transmission efficiency is increased. It is desirable that the fastening member be inserted and installed inside the first hollow section. However, a cap shape, for example, which envelops the rear end portion may also be used.

Preferably, through-holes are respectively formed in the vibrator assembly and fastening member, and a signal line (which is of a conductive material) is connected to the vibrator assembly via the through-holes. Since the signal line is led out from the interior of the horn body, the problems arising from the connection of the signal wires on the outside surface as in conventional devices can be eliminated. More specifically, the size of the rear end portion of the transducer can be reduced, and the space occupied by this rear end portion can be reduced.

Preferably, furthermore, a second hollow section which communicates with the tip end portion from the first hollow section is formed in the horn body. As a result of this second hollow section, the weight of the horn body can be reduced even further, and the conveying load of the transducer can be reduced.

A third hollow section which communicates with both the second hollow section and the outside may be formed in the tip end portion of the horn body. With this structure, the heat dissipating action is further enhanced, and thermal stability can be insured. It is also possible to install a cooling mechanism which forcibly feeds air, etc. into such a hollow section.

Preferably, a flange for holding the ultrasonic transducer is formed on the external surface of the horn body so as to positionally correspond to the first hollow section. In this case, it is desirable that the flange be formed in the position of a vibrational node. Here, it is desirable that the flange be formed integral to the horn body.

The above-described ultrasonic transducer to be installed in a bonding apparatus is manufactured by a unique method of the present invention that comprises:

a step in which a first hollow section that communicates with the rear end opening of the horn body is formed in the rear end portion of a horn body, a process in which a vibrator assembly is inserted into the first hollow section, a process in which a fastening member is provided in the first hollow section, and the vibrator assembly is fastened in place by being pushed in, and a process in which a signal wire is connected to a signal line that is led out to the outside from the vibrator assembly through the interior of the horn body.

BRIEF DESCRIPTION OF THE DRAWINGS

FIG. 2(A) shows an exploded view of the inner unit, and FIG. 2(B) shows a view from the rear end;

DETAILED DESCRIPTION OF THE PREFERRED EMBODIMENTS

Preferred embodiments of the present invention will be described below with reference to the attached figures.

Figure 1:
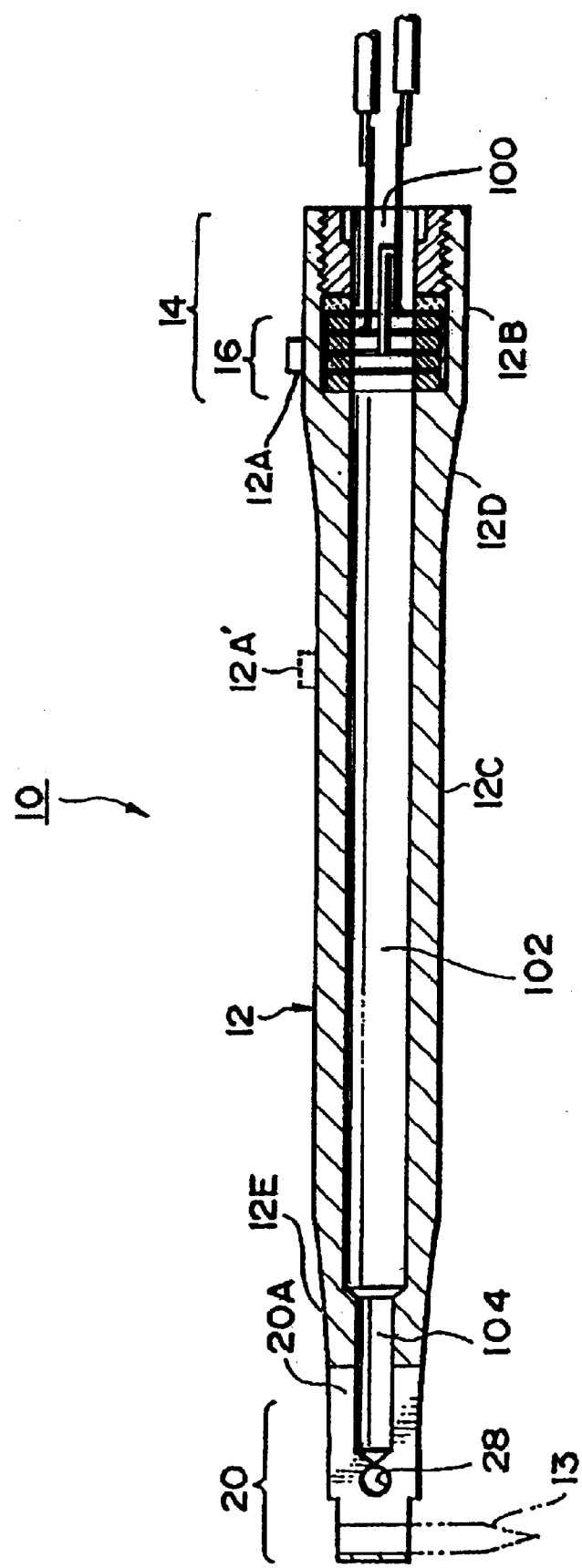
FIG. 1 is a sectional view of the ultrasonic transducer according to one embodiment of the present invention.

The ultrasonic transducer 10 shown in FIG. 1 is transmitting ultrasonic vibrations to bonding parts in a semiconductor manufacturing apparatus.

In FIG. 1, the horn body 12 is constructed from a material such as a titanium alloy, stainless steel, aluminum, and the like. The horn body 12 forms the main body of the ultrasonic transducer 10 and transmits the ultrasonic vibrations generated by a vibrator assembly 16 (which will be described in detail later) to a bonding tool 13. The bonding tool 13 contacts the bonding parts in a semiconductor manufacturing apparatus and transmits ultrasonic vibrations in order to realize ultrasonic press-bonding or thermal press-bonding combined with ultrasonic bonding. When the transducer 10 shown in FIG. 1 is installed in a wire bonding apparatus, a bonding wire is supplied to the tip end of the bonding tool 13 by a wire supply device (not shown).

The bonding tool 13 is held by a tool holding portion 20 which forms the tip end portion of the horn body 12. More specifically, a vertical slit 20A is formed in the horn holding portion 20 which is at the tip end of the horn body 12, and the bonding tool 13 is held by tightening the areas on both sides of this slit with a screw. In FIG. 1, the reference numeral 28 indicates a screw hole used for this purpose. This structure is similar to a conventional structure.

A flange is formed on the horn body 12 in the position of a vibrational node. In FIG. 1, a portion of the flange is shown by the reference numeral 12A. This flange is held by a bonding head (which is a conveying mechanism), which is not shown, so that the ultrasonic transducer 10 is moved three-dimensionally. As indicated by the reference numeral 12A', the flange can be installed at another position as a modification. This position also corresponds to the position of a vibrational node. The flange will be described later in more detail.

An inner unit 14 is installed inside the rear end portion of the horn body 12. In other words, a first hollow section 100 which communicates with the rear end opening is formed in the rear end portion of the horn body 12, and the inner unit 14 is inserted into this first hollow section 100. The internal circumferential wall of the first hollow section 100 functions as a tightening portion 12B as will be described later.

In the shown embodiment, a second hollow section 102 which communicates with the first hollow section 100 is formed in an intermediate portion 12C of the horn body 12. Furthermore, a third hollow section 104 which communicates with the second hollow section 102 is formed in the tip end portion of the horn body 12. The third hollow section 104 extends up to the slit 20A as seen from FIG. 1.

A through-hole which passes through the respective members is formed in the central portion of the inner unit 14. The diameter of this through-hole coincides with the diameter of the second hollow section 102. When the external diameter of the horn body 12 running from the base end toward the tip end is viewed, the diameter of the intermediate portion 12C is somewhat smaller than that of the base end portion, and a base tapered portion 12D is formed between these two portions. Tip end tapered portion 12E is formed at the tip end of the intermediate portion 12C, and this tip end tapered portion 12E is connected to the tool holding portion 20. In other words, the external diameter decreases stepwise from the base end portion toward the tip end of the horn body 12, though this decrease is gradual; and with this shape, an ultrasonic vibration amplifying effect is obtained. In the shown embodiment, as seen from FIG. 1, there is no significant change in cross-sectional area (i.e., there is no large step differences in cross-sectional area) at any point in the horn body 12. Thus, ultrasonic vibrations can be efficiently transmitted to the bonding tool 13.

Next, the inner unit 14 will be described in detail with reference to FIGS. 2(A) and 2(B).

An exploded view of the inner unit 14 is shown in FIG. 2(A), while an external view of the ultrasonic transducer 10 as seen from the base end is shown in FIG. 2(B).

As shown in FIG. 2(A), the inside of the tightening portion 12B forms the first hollow section 100, and this first hollow section 100 comprises a front space 100A and a rear space 100B. The vibrator assembly 16 is inserted and installed inside the front space 100A. Furthermore, a pressing block 42 is installed in the rear space 100B as a fastening means. Screw threads 30 are formed in the inside surface of the tightening portion 12B that faces the rear space 100B, and screw threads 44 are formed in the outer circumferential surface of the pressing block 42. The pressing block 42 is fastened to the tightening portion 12B by the engagement of these screw threads. The vibrator assembly 16 is pushed into the interior of the first hollow section 100 and fastened in place by a specified pressing force.

The vibrator assembly 16 is comprised of a plurality of electrostriction elements (piezoelectric elements) 32 and a plurality of electrode plates 34. The electrode plates 34 are respectively installed between the electrostriction elements 32, and one end (the right end in FIG. 2(A)) of the vibrator assembly 16 is covered with a single electrode plate 34. In other words, the vibrator assembly 16 has a structure in which a plurality of electrostriction elements 32 and a plurality of electrode plates 34 are laminated as in a conventional device. A cylindrical insulator 36 made of a Teflon tube or the like is installed around the outsides of these elements (32 and 34) in order to maintain electrical insulation.

Through-holes 34A are formed in the central portions of the respective electrode plates 34; and in the same manner, through-holes 32A are also formed in the central portions of the respective electrostriction elements 32. As a result, a through-hole is formed through the entire vibrator assembly 16.

Lead parts 38 are led out from the inside edges of the respective electrode plates 34, and the respective lead parts 38 are pair-connected via connecting elements 22 and led out toward the base end. This will be described in more detail with reference to FIGS. 3(A) and 3(B). It is desirable that at least the outer ends of the lead parts 38 or connecting elements 22 protrude to the outside from the rear end opening 200 when the vibrator assembly 16 is set inside the base end portion. As a result of this structure, the connection of signal wires (that will be described later) can be accomplished more easily.

A collar 40 made of, for instance, metal is interposed between the vibrator assembly 16 and the pressing block 42. This collar 40 functions as a slip ring. A through-hole 40A is formed in the central portion of the collar 40, and a through-hole 42A is formed in the central portion of the pressing block 42. Thus, a through-hole which extends through the entire inner unit 14 is formed by the through-holes 32A, 34A, 40A and 42A formed in the above-described respective components. The lead-out of the signal line (that comprise the connecting elements 22 and lead parts 38 which are of a conductive material), i.e., the lead-out of the leads, is accomplished using the through-hole. The above-described insulator 36 is positioned between the vibrator assembly 16 and the horn 12.

The pressing block 42 is made of a metal material such as a titanium alloy, stainless steel and the like. An engagement portion 46 which is to be engaged by a torque wrench, etc. is formed on the rear end opening of the pressing block 42.

The thus formed inner unit 14 as a whole is completely accommodated inside the base end portion of the ultrasonic transducer 10 as shown in FIG. 1. As a result, the external appearance of the base end portion is extremely simple. As will be described later, every other electrode plate 34 is set to be the same polarity. The collar 40 and the pressing block 42 have the same electric potential as the horn body 12. A high-frequency driving signal of, for instance, approximately 100 kHz is supplied to the vibrator assembly 16.

The ultrasonic transducer 10 of the present invention can be formed in various sizes according to the intended use. For example, the overall length can be set at 1 wavelength. In such a case, the overall length can be set at, for example, 35 mm. In this case, the external diameter of the base end portion of the horn body 12 may be set at, for example, 9 mm, the diameter of the first hollow section 100 may be set at, for example, 6.5 mm, and the diameter of the second hollow section 102 may be set at, for example, 3.5 mm. Furthermore, the radial thickness of the tightening portion 12B may be set at, for example, 1.0 mm.

Of course, the above numerical values are merely examples. Various configurations of the ultrasonic transducer of the present embodiment may be used as long as the vibrator assembly 16 is accommodated inside the horn body 12.

Figure 3A:
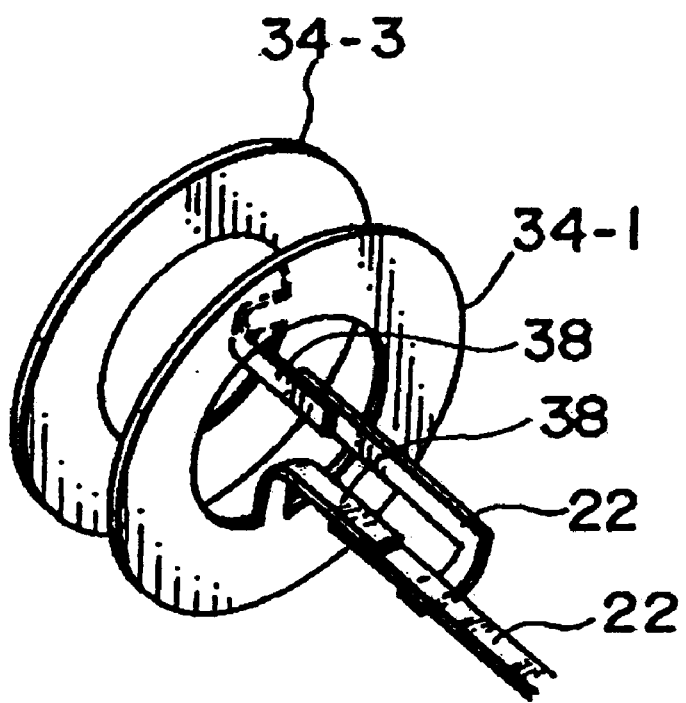
FIGS. 3(A) and 3(B) are perspective views of the connection relationship of the plurality of electrode plates.
Figure 3B:
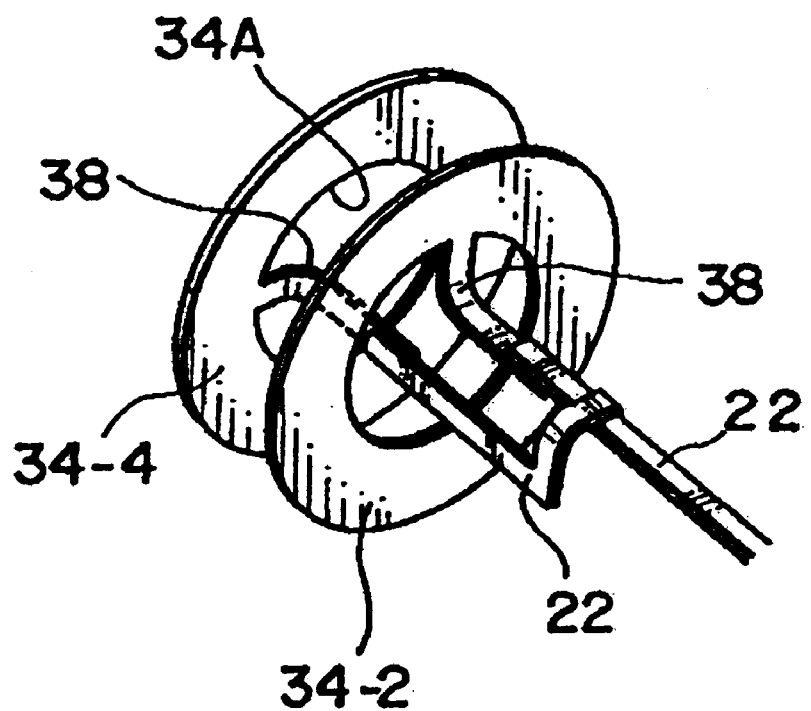

FIGS. 3(A) and 3(B) show the respective electrode plates 34 shown in FIG. 2(A). In the shown embodiment, as seen from FIG. 2(A), four electrode plates 34 are employed. Among these four electrode plates 34, the first and third electrode plates 34-1 and 34-3 are shown in FIG. 3(A), and the second and fourth electrode plates 34-2 and 34-4 are shown in FIG. 3(B). As seen from FIGS. 3(A) and 3(B), through-holes 34A are formed in the respective electrode plates 34, and lead parts 38 are led out toward the rear end opening of the horn body 12 from the inside edges of the electrode plates 34. The respective lead plates 38 having the same polarity are connected by connecting elements 22, and the end portions of these lead parts 38 and connecting elements 22 are led out to the outside beyond the rear end opening of the horn body 12 as described above. As seen from FIG. 1 and FIG. 4(A), the conductive element of each signal wire 24 is connected to one end of each connecting element 22.

The mutual connections between the respective lead parts 38, connecting elements 22 and conductive elements of the signal wire 24 are accomplished by, for instance, spot welding. Of course, the method for connecting the signal line to the respective electrode plates is not limited to the method described above. Various types of connections can be employed as long as the signal line connection is made inside the inner unit 14.

Figures 4A, 4B:
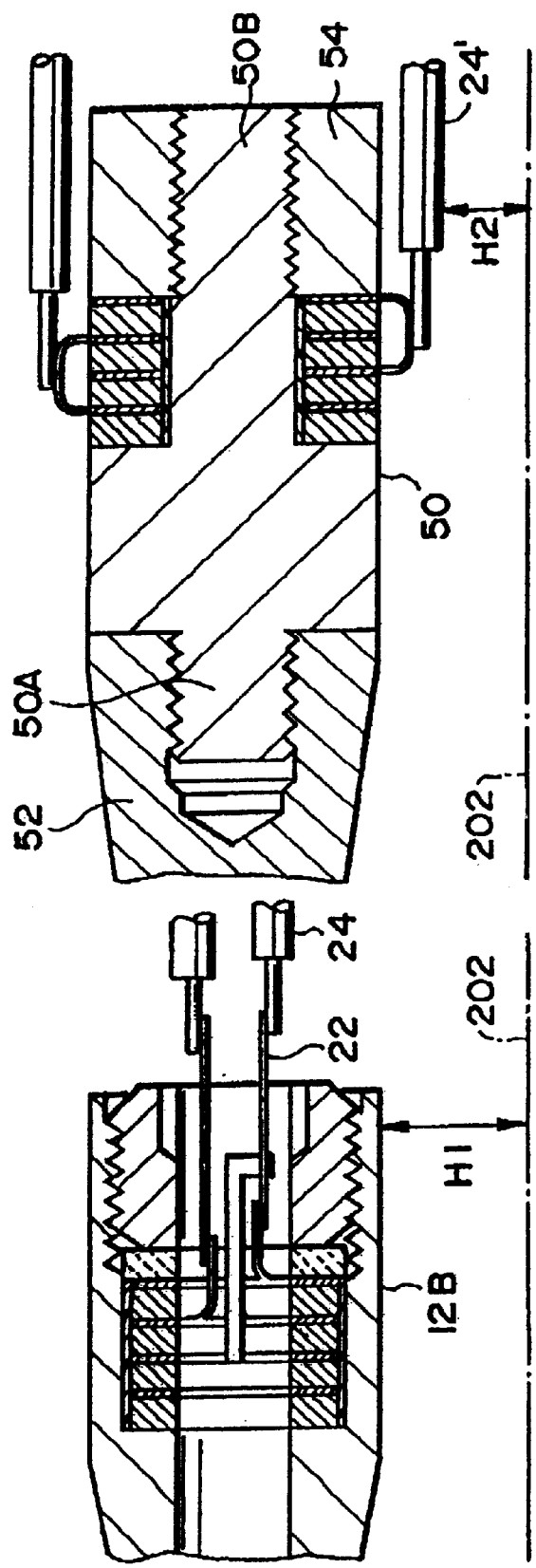
FIGS. 4(A) and 4(B) are diagrams which show the differences in effect between the present invention and a comparative example (prior art)

The base end portion of the ultrasonic transducer 10 of the present invention is shown in FIG. 4(A), and the base end portion of an ultrasonic transducer that uses a bolt-fastened ultrasonic vibrator is shown as a comparative example in FIG. 4(B).

In the comparative example, this bolt-fastened ultrasonic vibrator shown in FIG. 4(B) has a structure in which a plurality of electrostriction elements, etc. are held by two blocks via a bolt 50A. More specifically, the front-side block 50 is formed as an integral unit with a bolt 50B, and the bolt 50B screw-engages with the rear-side block 54. A connecting bolt 50A is formed on the front-side block 50, and this connecting bolt 50A engages with the base end portion of the horn 52. In this comparative example, as is clear from the above description and FIG. 4(B), the side surfaces of the laminated bodies are completely exposed to the outside, and the connection of the signal wires 24' to these laminated bodies is accomplished using these exposed surfaces. Accordingly, the space needed for such connections cannot be ignored, and the size of the base end portion of the ultrasonic transducer tends to be large. To the contrary, in the present invention as shown in FIG. 4(A), the connection of the signal wires 24 is accomplished at the rear end of the horn body 12. Accordingly, any outward protrusion on the base end portion of the horn body 12 (or the transducer) can be eliminated, and the space for the protrusion can be eliminated.

For example, when the distances to the bonding surface 202 on which bonding is to be performed are compared, if the axial centers of the transducers of the present embodiment and the comparative example are at the same height, the transducer of the present invention has a distance H1 which is from the side surface of the base end portion to the bonding surface 202. In the comparative example, on the other hand, the transducer has only a distance H2 from the signal wire 24' on the side surface of the base end portion to the bonding surface 202 which is conspicuously small.

As a result, in the comparative example, the range of movement of the ultrasonic transducer is restricted, and the electrostriction elements are susceptible to thermal effects from the bonding surface 202. In the present invention, the space for movement of the ultrasonic transducer is large, and in addition the electrostriction elements are protected from physical and thermal effects. Furthermore, since through-holes are formed in at least the inner unit 14 inside the base end portion of the horn body 12, a heat-dissipating effect is expected in this portion. In addition, with the second hollow section 102 formed inside the horn body 12, the overall weight of the horn body 12 is reduced with an increased overall surface area. The thermal stability caused by air cooling can be insured.

Figure 5:
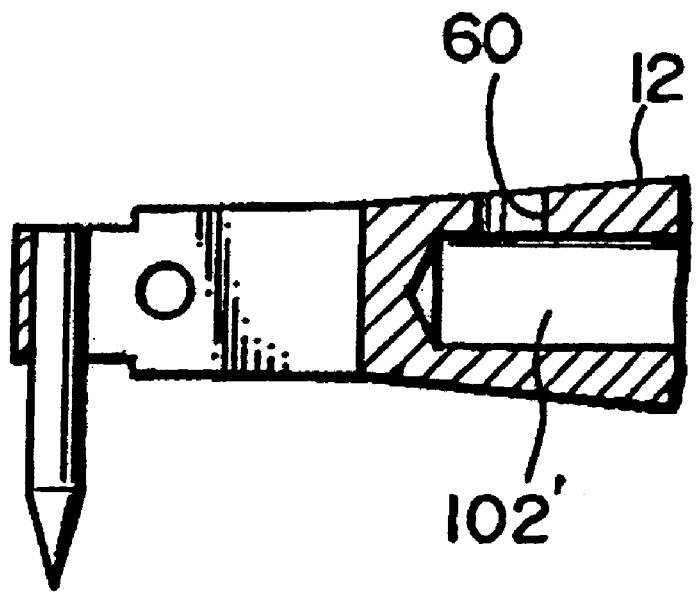
FIG. 5 is a sectional view of a modification of the horn body of the present invention.

Of course, it is possible to increase the cooling effect by forcibly feeding air into the interior of the horn body 12. In this case, since the third hollow section 104 faces the slit 20A, the circulation of air can be effected from this portion. Alternatively, as shown in FIG. 5, it is also possible to form a hollow section 102' (which is in the form of a non-through-hole) inside the horn body 12 and further to form a small hole 60 that communicates with this hollow section 102' in an appropriate portion of the horn body 12. Air circulation can be effected by means of this structure. With this structure, it is possible to eliminate the effects of direct outflow of air to the bonding tool.

In the above embodiments, the vibrator assembly 16 has a ring-form or cylindrical shape. However, the present invention is naturally not limited to such a shape. The vibrator assembly 16 may be of, for instance, a rectangular shape. Furthermore, the pressing block 42 in the above embodiment is completely inside the first hollow section 100. However, the pressing block 42 may also be formed so as to envelop the base end portion if the horn body 12. Thus, various configurations may be employed as long as the vibrator assembly 16 is securely held between the contact surface 204 (see FIG. 2(A) of the first hollow section and the contact surface 206 of the pressing block 42.

Figure 6:
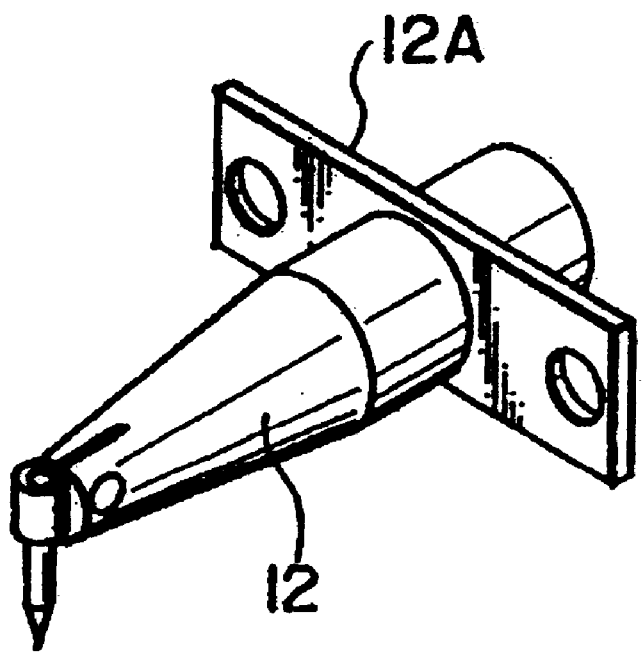
FIG. 6 is a schematic perspective view of the ultrasonic transducer.

FIG. 6 is a schematic perspective view of the ultrasonic transducer of the present invention. As described above, the flange 12A is formed as an integral part of the horn body 12. The flange 12A formed on the external circumferential surface of the horn body 12 is positionally correspond to the vibrator assembly and at a position that corresponds to vibrational nodes (central position of the vibrator assembly).

Accordingly, even if the overall length of the ultrasonic transducer is as short as one wavelength, the flange can be installed utilizing the vibrational node located at the center of the vibrator assembly. Furthermore, the need for flange attachment work can be eliminated, and the number of components can be reduced also. In addition, the positioning precision of the flange can be improved. Furthermore, since the flange is positioned at the center of the vibrator assembly, the effect of the bending stress applied to the flange during bonding on the vibrator assembly can be reduced. Stable ultrasonic vibrations can thus be generated.

As seen from the above according to the present invention, the shape of the rear end portion of an ultrasonic transducer can be simplified. Furthermore, in the present invention, the space occupied by the base end portion of the ultrasonic transducer can be reduced by leading signal lines out from the interior of the main body. Moreover, since the vibrator assembly is inside the horn body, the vibrator assembly can be protected from various effects.

What is claimed is:

1. An ultrasonic transducer for a bonding apparatus, said transducer comprising:
   a horn body which has a bonding tool at a tip end portion thereof and has a hollow section formed in at least a rear end portion thereof,
   a vibrator part which is accommodated in said first hollow section and generates an ultrasonic vibration,
   a fastening member which is inserted via a rear end opening formed in said rear end portion of said horn body, said fastening member pushing said vibrator part into said first hollow section and fasting said vibrator part in place, and wherein
      an internal circumferential wall of said first hollow section of said horn body functions as a tightening member for both ends of said vibrator part.

2. An ultrasonic transducer for a bonding apparatus according to claim 1, wherein
   through-holes are respectively formed in said vibrator part and fastening member, and
   a signal line is connected to said vibrator part via said through-holes.

3. An ultrasonic transducer for a bonding apparatus according to claim 1, wherein a second hollow section which communicates with said tip end portion from said first hollow section is formed in said horn body.

4. An ultrasonic transducer for a bonding apparatus according to claim 1, wherein a flange for holding said ultrasonic transducer is formed on an external circumferential surface of said first hollow section of said horn body.

5. An ultrasonic transducer for a bonding apparatus according to claim 3, wherein a flange for holding said ultrasonic transducer is formed on an external circumferential surface of said first hollow section of said horn body.

6. A method for manufacturing an ultrasonic transducer for a bonding apparatus, said manufacturing method comprising the steps of:
   forming a first hollow section in an rear end portion of a horn body of said ultrasonic transducer, said first hollow section communicating with a rear end opening of said horn body,
   inserting a vibrator part into said first hollow section,
   installing a fastening member in said first hollow section so as to push in and fasten said vibrator part in place, and
   connecting a signal wire to a signal line that is led out to an outside from said vibrator part through an interior of said horn body.

* * * * *